(12) United States Patent
Xue et al.

(10) Patent No.: US 11,552,244 B2
(45) Date of Patent: *Jan. 10, 2023

(54) MAGNETIC TUNNEL JUNCTION STRUCTURES AND METHODS OF MANUFACTURE THEREOF

(71) Applicant: Applied Materials, Inc., Santa Clara, CA (US)

(72) Inventors: Lin Xue, San Diego, CA (US); Chi Hong Ching, Santa Clara, CA (US); Rongjun Wang, Dublin, CA (US); Mahendra Pakala, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 22 days.

This patent is subject to a terminal disclaimer.

(21) Appl. No.: 17/193,966

(22) Filed: Mar. 5, 2021

(65) Prior Publication Data

US 2021/0193914 A1 Jun. 24, 2021

Related U.S. Application Data

(63) Continuation of application No. 16/351,850, filed on Mar. 13, 2019, now Pat. No. 10,944,050.

(Continued)

(51) Int. Cl.
*H01L 29/82* (2006.01)
*H01L 43/12* (2006.01)
(Continued)

(52) U.S. Cl.
CPC ............ *H01L 43/12* (2013.01); *H01L 27/224* (2013.01); *H01L 43/02* (2013.01); *H01L 43/08* (2013.01); *H01L 43/10* (2013.01)

(58) Field of Classification Search
IPC ...................................................... H01L 27/224
See application file for complete search history.

(56) References Cited

U.S. PATENT DOCUMENTS 6,960,480 B1  11/2005  Horng et al.
7,999,360 B2   8/2011  Hong et al.
(Continued)

FOREIGN PATENT DOCUMENTS

WO   2016148394       9/2016
WO   2016148394 A1    9/2016

OTHER PUBLICATIONS

International Search Report and Written Opinion for Application No. PCT/US2019/026079 dated Jul. 25, 2019.

*Primary Examiner* — Niki H Nguyen
(74) *Attorney, Agent, or Firm* — Patterson + Sheridan, LLP (57) ABSTRACT

Embodiments of magnetic tunnel junction (MTJ) structures discussed herein employ seed layers of one or more layer of chromium (Cr), NiCr, NiFeCr, RuCr, IrCr, or CoCr, or combinations thereof. These seed layers are used in combination with one or more pinning layers, a first pinning layer in contact with the seed layer can contain a single layer of cobalt, or can contain cobalt in combination with bilayers of cobalt and platinum (Pt), iridium (Ir), nickel (Ni), or palladium (Pd), The second pinning layer can be the same composition and configuration as the first, or can be of a different composition or configuration. The MTJ stacks discussed herein maintain desirable magnetic properties subsequent to high temperature annealing.

15 Claims, 4 Drawing Sheets

Related U.S. Application Data

(60) Provisional application No. 62/668,559, filed on May 8, 2018.

(51) Int. Cl.
*H01L 27/22* (2006.01)
*H01L 43/02* (2006.01)
*H01L 43/08* (2006.01)
*H01L 43/10* (2006.01)

(56) References Cited

U.S. PATENT DOCUMENTS

| | | |
|---|---|---|
| 8,063,459 B2 | 11/2011 | Ranjan et al. |
| 8,922,956 B2 * | 12/2014 | Lu .................. G01R 33/098 360/324.2 |
| 9,203,014 B2 | 12/2015 | Lee et al. |
| 9,236,560 B1 * | 1/2016 | Li ........................ H01L 43/10 |
| 9,312,474 B2 | 4/2016 | Kim et al. |
| 9,490,054 B2 | 11/2016 | Jan et al. |
| 9,634,237 B2 | 4/2017 | Lee et al. |
| 2006/0211155 A1 | 9/2006 | Min et al. |
| 2009/0251829 A1 | 10/2009 | Zhang et al. |
| 2010/0176470 A1 * | 7/2010 | Horng .................. H01L 43/08 257/E29.323 |
| 2011/0014500 A1 | 1/2011 | Horng et al. |
| 2016/0141496 A1 * | 5/2016 | Park .................... G11C 11/161 438/3 |
| 2016/0301000 A1 | 10/2016 | Kim et al. |
| 2017/0186942 A1 | 6/2017 | Lee et al. |
| 2018/0301619 A1 | 10/2018 | Oguz et al. |
| 2019/0043548 A1 | 2/2019 | Park et al. |

* cited by examiner

MAGNETIC TUNNEL JUNCTION STRUCTURES AND METHODS OF MANUFACTURE THEREOF

CROSS-REFERENCE TO RELATED APPLICATIONS

This application is a continuation of U.S. patent application Ser. No. 16/351,850 filed Mar. 13, 2019, which will issue as U.S. Pat. No. 10,944,050 on Mar. 9, 2021, which claims benefit of U.S. Provisional Patent Application No. 62/668,559, filed May 8, 2018, each of which is herein incorporated by reference in its entirety.

BACKGROUND

Field

Embodiments of the present disclosure generally relate to fabricating magnetic tunnel junction structures for magnetic random access memory (MRAM) applications.

Description of the Related Art

Spin transfer torque magnetic random access memories, or STT-MRAMs, employ magnetic tunnel junction structures in the memory cells thereof, wherein two ferro-magnetic layers are spaced from one another by a thin insulating or "dielectric" layer. One of the magnetic layers has a fixed magnetic polarity, the other has a magnetic polarity which is selectively changeable between two states. Where the magnetic layers have perpendicular magnetic anisotropy, the polarity of the changeable polarity layer can be switched between having the same polarity as the fixed polarity layer, or the opposite polarity to that of the fixed polarity layer, in the depth direction of a stack of film layers comprising the magnetic tunnel junction or "MTJ" structure. The electric resistance across the MTJ is a function of the polarity of the changeable polarity layer with respect to the fixed polarity layer. Where the polarities of the two layers are the same in the depth direction of the MTJ, the electric resistance across the MTJ is low, and when they are opposite to one another in the depth direction of the MTJ, the electric resistance across the MTJ is high. Thus, the electrical resistance across the memory cell can be used to indicate a value of 1 or 0, and thus store a data value, for example by using the low resistance state as having the data value of 1, and the high resistance state as the data value of 0.

Where MTJs are synthetic anti-ferromagnets (SAF) that comprise two or more ferromagnetic layers separated by a nonmagnetic layer, SAF coupling can be lost after high temperature processing thereof, for example processing at temperatures at or above about 400° C.

To form an MTJ stack, a film layer stack including a seed layer comprising platinum (Pt) or ruthenium (Ru) is used to ensure the proper crystalline orientation, here a face cubic centered <111> orientation, in the overlying pinning layers to establish therein perpendicular magnetic isotropy or PMA. To properly form the MRAM cell, the film stack is annealed at around 400° C. for about 0.5 to 3 hours. However, during this annealing, the crystal lattice and resulting crystal and magnetic pole orientation in the pinning layers is lost, or at least partially lost, resulting in a loss of the desired (SAF) coupling.

Thus, there remains a need for an improved MTJ stack.

SUMMARY

The present disclosure generally relates to the design and fabrication of magnetic tunnel junction (MTJ) stacks used for memory cells. In one example, a device includes a magnetic tunnel junction stack. The magnetic tunnel junction stack includes a seed layer in contact with a buffer layer, wherein the seed layer comprises chromium (Cr) and a first pinning layer in contact with the seed layer. The first pinning layer is formed from a plurality of bilayers, wherein each bilayer of the plurality of bilayers comprises a first interlayer formed from cobalt (Co) and a second interlayer formed from platinum (Pt), iridium (Ir), nickel (Ni), or palladium (Pd). The MTJ stack further includes a coupling layer in contact with the first pinning layer; and a second pinning layer in contact with the coupling layer.

In another example, a magnetic tunnel junction stack includes: a seed layer formed on a buffer layer, wherein the seed layer comprises chromium (Cr) and a first pinning layer formed on the seed layer, wherein the first pinning layer comprises a first plurality of bilayers. Each bilayer of the first plurality of bilayers comprises a first interlayer formed from cobalt (Co) and a second interlayer formed from at least one of platinum (Pt), iridium (Ir), nickel (Ni), or palladium (Pd). The MTJ stack can further include a coupling layer formed on the first pinning layer; and a second pinning layer formed on the coupling layer, wherein the second pinning layer comprises cobalt (Co).

In another example, a magnetic tunnel junction stack includes a seed layer formed on a buffer layer, wherein the seed layer comprises chromium (Cr), and is from 1 Å to 100 Å thick and a first pinning layer formed on the seed layer, the first pinning layer having a thickness from 1 Å to 100 Å, wherein the first pinning layer comprises a first plurality of bilayers and a first cobalt overlayer formed over the first plurality of bilayers. The MTJ stack further includes a coupling layer formed between the first pinning layer and the first cobalt overlayer; a second pinning layer formed on the coupling layer, the second pinning layer having a thickness from 1 Å to 100 Å thick, wherein the second pinning layer comprises a second plurality of bilayers; a structure blocking layer formed on the second pinning layer. The structure blocking layer includes at least one of tantalum (Ta), molybdenum (Mo), or tungsten (W). and is from 1 Å to 8 Å thick. The MTJ stack further includes a magnetic reference layer formed on the structure blocking layer; a tunnel barrier layer formed on the magnetic reference layer; and a magnetic storage layer formed on the tunnel barrier layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to magnetic tunnel junction (MTJ) stacks and STT MRAM memory cells and memories. Herein, the MTJ stacks are incorporated in a film stack including upper and lower electrodes, wherein the MTJ stack is sandwiched therebetween and can be used to form a plurality of memory cells used in magneto-resistive random-access memory (MRAM). In each MTJ stack of an MRAM, there are two magnetic layers, wherein one magnetic layer has a fixed polarity and the other has a polarity that can be switched by imposing a voltage across the layer or applying a current to that magnetic layer. The electrical resistance across the MRAM changes based on the relative polarity between the first and second magnetic layers. The first and second magnetic layers are referred to herein as a magnetic reference layer and a magnetic storage layer. The memory cells formed from the MTJ stacks operate when there is a voltage imposed across or a current passed through the memory cell. In response to the application of voltage of sufficient strength, the polarity of the switchable magnetic layer can be changed. Additionally, the resistivity of the memory cell can be determined by measuring the current vs voltage relationship across the memory cell at a relatively low voltage below the threshold required to switch the magnetic polarity of the magnetic storage layer.

The basic MTJ stack discussed herein is formed using a plurality of deposition chambers to deposit thin film layers on a substrate, and ultimately pattern and etch those deposited film layers. The deposition chambers used to form the MTJ stack discussed herein includes physical vapor deposition (PVD) chambers. Here PVD chambers are used to form the plurality of thin film layers of the MTJ stack. The MTJ stack thus includes a buffer layer, a seed layer on the buffer layer, a first pinning layer on the seed layer, a synthetic antiferromagnetic (SAF) coupling layer on the first pinning layer, a second pinning layer on the SAF layer, and a blocking layer on the second pinning layer. In the PVD operations described hereof, an inert or noble gas such as argon (Ar), helium, (He), krypton (Kr), and/or xenon (Xe), is ionized as a plasma in the sputtering chamber while the chamber is maintained in a vacuum state. The PVD process chamber further contains at least one sputtering target and a substrate disposed facing a generally flat surface of the sputtering target. The sputtering target is coupled to a power supply such that it is electrically driven, or self establishes, a cathodic state in a circuit of the power supply, through the plasma, to ground, for example a grounded portion of the sputtering chamber. The substrate is disposed on a pedestal or other structure in the sputtering chamber, which may be at a floating potential, connected to ground, or may be biased to form an anode in the cathodic target to generate plasma to anode or ground circuit. The positively ionized portion of the inert gas atoms in the sputtering chamber are electrically attracted to the negatively biased target, and thus ions of the plasma bombard the target, which causes atoms of the target material to be ejected and deposit on the substrate to a form a thin film composed of the target material(s) on the substrate.

In order to form a thin film of a compound, a sputtering target including that compound can be used along with an Ar plasma in a PVD chamber. In another example, a plurality of sputtering targets, each including one or more elements of the compound to be formed as a film on the substrate, are present in the PVD chamber and used with an Ar plasma to form a desired compound. Further in the PVD operations used herein to form layers of the MTJ stack, metal-oxides and metal-nitrides are formed using either a metal-oxide or a metal-nitride sputtering target. In alternate embodiments, the metal-oxide or metal-nitride layers are formed in a PVD chamber by sputtering one or more metal sputtering targets composed of the metal of the metal oxide or nitride while Ar plasma and either oxygen ($O_2$) or nitrogen ($N_2$) are present in the PVD chamber. In one example, a PVD chamber has a plurality of sputtering targets disposed therein, each sputtering target in the PVD chamber is biased by a power supply to establish a negative bias thereon, either by direct application of a negative DC bias thereto, or by using a waveform to electrically drive or self-establish a cathodic state on the target, or combinations thereof. In this example, a shield inside the PVD chamber is configured to block one or more of the plurality of targets while allowing ions of the plasma formed in the PVD chamber to bombard at least one of the targets to eject or sputter target material atoms therefrom to form a thin film on the substrate while protecting other sputtering targets in the chamber from the plasma. In this example, one or targets are exposed to the Ar plasma, and the sputtering thereof in series or simultaneously forms the desired film composition on the substrate, and a separate PVD chamber is used to form metal-oxide and metal-nitride layers when $O_2$ or $N_2$, respectively, are used in addition to Ar plasma for film layer formation on the substrate.

A PVD system can include one or more PVD sputtering chambers coupled to a central robotic substrate transfer chamber. The central robotic substrate transfer chamber is configured to move substrates between loading stations coupled thereto and the sputtering chambers connected thereto. The PVD system is kept at a base vacuum pressure of, for example, 10 $E^{-9}$ Torr, so that the substrate on which the MTJ stack is being formed is not exposed to an external atmosphere when the substrate on which the MTJ stack is being formed is moved among and between PVD chambers during fabrication of the MTJ film layer stack thereon. Prior to forming the initial film layer of the MTJ film layer stack on a substrate, the substrate is degassed in a vacuum chamber and pre-cleaned using an Ar gas plasma or in an He/H gas plasma in a dedicated precleaning chamber connected to the central robotic transfer chamber. During fabrication of the MTJ stack using the one or more PVD chambers, one or more noble or inert sputtering gases such as Ar, Kr, He, or Xe can be disposed in each of the PVD chambers. The gases are ionized to form a plasma in the chamber, and the ions of the plasma bombard the negatively biased sputtering target(s) to eject surface atoms from the target to deposit a thin film of the target material(s) on a substrate located in the PVD sputtering chamber. In an embodiment, a processing pressure in the one or more PVD chambers can be from about 2 mTorr to about 3 mTorr. Depending upon the embodiment, the chambers of the PVD platform are held from −200° C. to 600° C. during fabrication of at least the seed layer, the first and second pinning layers, the SAF layer and the buffer layer of the MTJ stack.

Figure 1A:
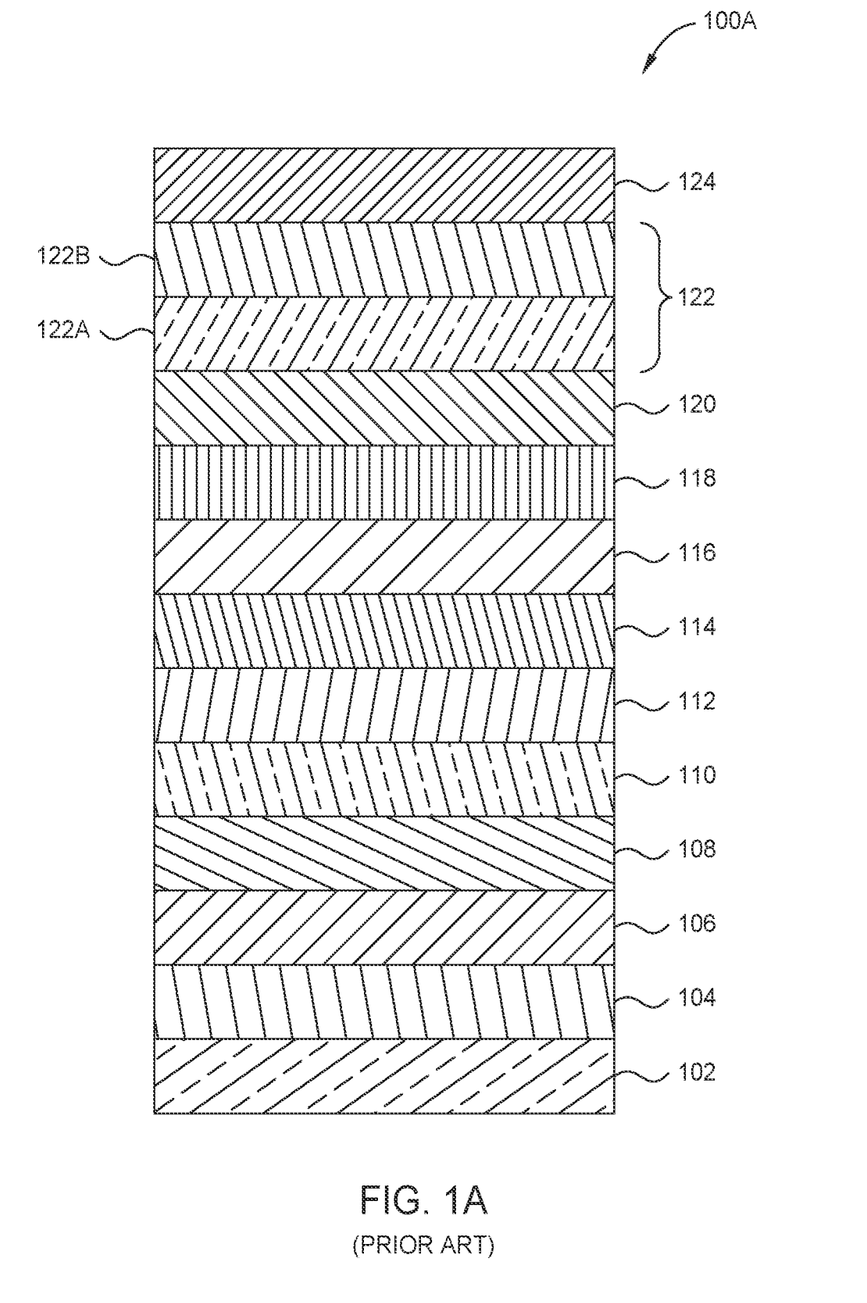
FIG. 1A is a schematic illustration of an example magnetic tunnel junction (MTJ) stack.

FIG. 1A is a schematic illustration of a magnetic tunnel junction (MTJ) stack. FIG. 1A shows a conventional MTJ stack 100A that includes a substrate 102 that has a conductive layer of tungsten (W), tantalum nitride (TaN), titanium nitride (Tin), or other metal layers formed thereof. In some examples, the substrate 102 includes one or more transistors, bit or source lines, and other memory lines, previously fabricated therein or thereon, or other elements to be used in MRAM memory and previously fabricated or formed thereon. The substrates on which the MTJ stacks are formed can have dimensions including a diameter of less than 200 mm, a diameter of 200 mm, a diameter of about 300 mm, about 450 mm, or another diameter, and may have a shape of a circle or a rectangular or square panel.

A buffer layer 104 in the conventional MTJ stack 100A is formed on the substrate 102 by sputtering one or more targets in a PVD chamber having the substrate therein, and here includes one or more layers of $Co_xFe_yB_z$, TaN, Ta, or combinations thereof. A seed layer 106 formed via sputtering in a PVD chamber over the buffer layer 104. The buffer layer 104 is used in the conventional MTJ stack 100A to improve adhesion of the seed layer 106 to the substrate. The seed layer 106 here includes platinum (Pt) or ruthenium (Ru) and is formed by sputtering a target of Pt or Ru, or an alloy thereof, in a PVD chamber having the substrate therein. The seed layer 106 can be used to improve adhesion and seeding of subsequently deposited layers in the conventional MTJ stack 100A by reducing or eliminating lattice mismatch between the buffer layer 104 and the seed layer 106.

A first pinning layer 108 is formed on the seed layer 106 by sputtering. The first pinning layer 108 here includes a cobalt (Co) layer, one or more Co-containing bilayers, or a combination of the cobalt layer and one or more Co-containing bilayers. A synthetic antiferromagnetic (SAF) coupling layer 110 is formed here over the first pinning layer 108 by sputtering. The SAF coupling layer 110 can be formed of ruthenium (Ru), rhodium (Rh), Cr, or iridium (Ir) sputtered from a target thereof. A second pinning layer 112 is formed over the SAF coupling layer 110 by sputtering. The second pinning layer 112 is formed here of a single cobalt (Co) layer, at least one cobalt-platinum bilayer, or a combination of the cobalt layer and the one or more Co-containing bilayers, such as a Co—Pt bilayer, formed by sputtering a target composed of Co, Pt, or Co—Pt, respectively. The SAF coupling layer 110 is located between the first pinning layer 108 and the second pinning layer 112 and causes surface atoms of the first pinning layer 108 and the second pinning layer 112, when exposed to a magnetic field, to align with surface atoms of the SAF coupling layer 110, thereby pinning the orientation of the first pinning layer 108 and the second pinning layer 112. The first pinning layer 108 and the second pinning layer 112 each exhibit similar magnetic moments, and will thus react similarly when an external magnetic field is applied to the conventional MTJ stack 100A. The SAF coupling layer 110 maintains an anti-parallel alignment of the magnetic moments of the first pinning layer 108 and second pinning layer 112.

A structure blocking layer 114 is formed over the second pinning layer 112, and here includes tantalum (Ta), molybdenum (Mo), tungsten (W), or combinations thereof. The structure blocking layer 114 is employed because of its crystalline structure, which differs from the crystalline structure of the first pinning layer 108 and second pinning layer 112. The structure blocking layer 114 prevents against formation of a short circuit between the conventional MTJ stack 100A and metallic contacts that can be coupled to the conventional MTJ stack 100A to form MRAM memory cells.

Further in the conventional MTJ stack 100A, a magnetic reference layer 116 is formed over the structure blocking layer 114 by sputtering in a PVD chamber. A tunnel barrier layer 118 is formed over the magnetic reference layer 116 and a magnetic storage layer 120 is formed over the tunnel barrier layer 118. Each of the tunnel barrier layer 118, the magnetic reference layer 116, and the magnetic storage layer 120 are each formed by sputtering in one or more PVD chambers in the presence of an Ar plasma. The magnetic reference layer 116 and the magnetic storage layer 120 each include a $Co_xFe_yB_z$ alloy which may vary in composition. Additionally, the magnetic storage layer 120 can include one or more layers of Ta, Mo, W, or Hf, or combinations thereof. The tunnel barrier layer 118 includes an insulating material, and can be fabricated from a dielectric material such as MgO. A composition and a thickness of the tunnel barrier layer 118 are selected so as to create a large tunnel magnetoresistance ratio (TMR) in the tunnel barrier layer 118 of the conventional MTJ stack 100A. The TMR is a measurement of a change in resistance in the conventional MTJ stack 100A from the anti-parallel state ($R_{ap}$) to the parallel state ($R_p$) and can be expressed as a percentage using the formula (($R_{ap}-R_p$)/$R_p$). When a bias is applied to the conventional MTJ stack 100A, the tunnel barrier layer 118 is traversed by spin-polarized electrons, this transmission of electrons through the tunnel barrier layer 118 results in electrical conduction between the magnetic reference layer 116 and the magnetic storage layer 120.

Figure 1B:
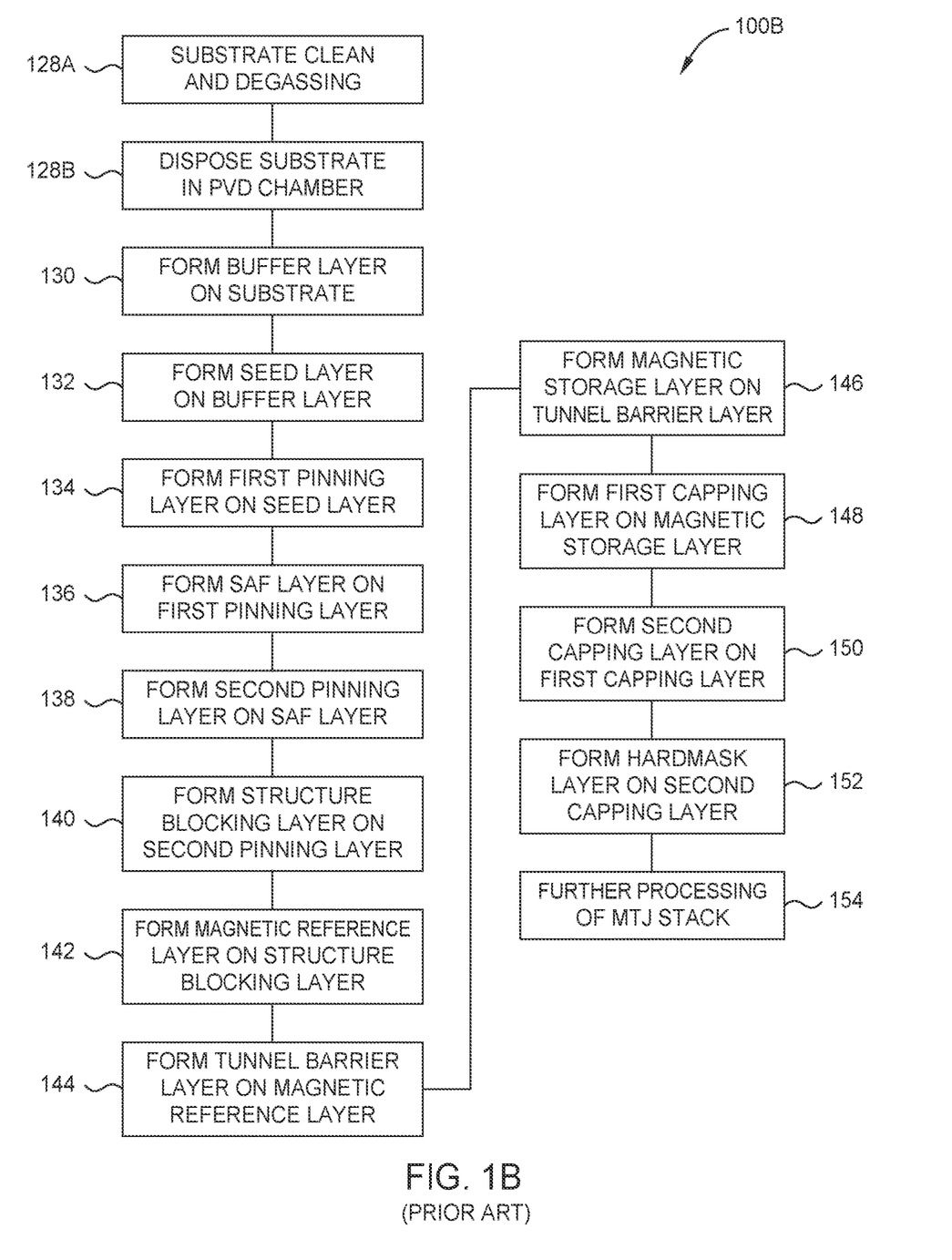
FIG. 1B is a flow diagram of a method of fabricating memory devices including magnetic tunnel junction (MTJ) stacks of FIG. 1A and according to embodiments of the present disclosure.

A capping layer 122 is formed, sputtering in a PVD chamber, on the magnetic storage layer 120 and here includes a plurality of interlayers. The plurality of interlayers of the capping layer 122 includes a first capping interlayer 122A fabricated from a dielectric material such as MgO. A second capping interlayer 122B including a metallic material such as Ru, Ir, Ta, or combinations thereof, is formed over the first capping interlayer 122A. The first capping interlayer 122A acts as an etch stop layer for hard mask etching and protects the MTJ stack 100A from corrosion. The second capping interlayer 122B is configured to electrically communicate with transistors or contacts when the conventional MTJ stack 100A is later patterned, as shown in FIG. 1B and discussed below. A hardmask layer 124 is formed in a PVD chamber by sputtering, and is formed over the second capping interlayer 122B to protect the conventional MTJ stack 100A and can be patterned during subsequent operations.

FIG. 1B is a flow diagram of a method 100B of fabricating memory devices that include an MTJ stack 100A and the MTJ stacks fabricated according to embodiments of the present disclosure and shown in FIGS. 2A-2F. The method 100B is executed in part a plurality of PVD chambers of a PVD system that are configured to deposit thin film layers by sputtering. The substrate 102 can be moved among and between sputtering chambers via the central robotic transfer chamber of the PVD system to form various thin film layers, including those in FIG. 1A and those shown and discussed below that are fabricated according to embodiments of the present disclosure. In another example, as discussed above, a plurality of sputtering targets are disposed in a PVD chamber and a shield inside the PVD chamber is configured to selectively protect the plurality of sputtering targets from plasma exposure or expose a target thereto. The shield is rotated at different operations of the method 100B to expose two or more targets, in series or simultaneously, to the plasma in the PVD chamber.

The layers of FIG. 1A are thus referenced herein with respect to the method 100B. The operations of the method 100B are performed using one or more gases including argon (Ar), helium (He), krypton (Kr), xenon (Xe), oxygen ($O_2$), or nitrogen ($N_2$) in the PVD chamber or chambers. The processing pressure in the PVD chambers during the method 1006 can be from about 2 mTorr to about 3 mTorr. Depending upon the embodiment, a PVD chamber can be held from −200° C. to 600° C. during fabrication of the pinning and seed layers of the MTJ stack.

The substrate 102 can be moved among and between PVD chambers depending upon the composition of the sputtering target(s) used for each layer of the MTJ stack 100A, or, as discussed herein, a plurality of targets are coupled to a power supply and a shield is configured to selectively protect some of the targets, such that one or more targets are exposed in series or simultaneously to form the desired film composition, or both methodologies can be performed. During sputtering in the PVD chamber, the Ar ions of the plasma bombard the one or more exposed sputtering targets, causing surface atoms of the sputtering targets to be ejected and deposit as a thin film on the substrate. In the method 1006, at operation 128A, a substrate such as the substrate 102 in FIG. 1A undergoes operations including degassing, and pre-cleaning in an Ar gas plasma or in an He/H plasma, and is moved between process chambers through or via a central robotic substrate transfer chamber. At operation 128B, the substrate 102 is transferred from the central robotic substrate transfer chamber to a PVD chamber of a plurality of PVD chambers. Subsequently, at operation 130, the buffer layer 104 is deposited on the substrate 102 by sputtering in the target of the PVD chamber. A power from 1 kW to 100 kW is applied to the one or more PVD chambers discussed herein to ionize a portion of the Ar and form the plasma used in the operation 130. The ejected surface atoms of the target are deposited on the substrate 102 to form the buffer layer 104. During formation of the buffer layer 104 at the operation 130, a sputtering target or targets including $Co_xFe_yB_z$, TaN, and/or Ta are used in the PVD chamber along with Ar plasma to form the buffer layer 104. In an embodiment where the buffer layer 104 is or includes Ta, the buffer layer 104 is sputtered in a PVD chamber using a Ta target and Ar plasma. In an example where the buffer layer 104 is or includes TaN, the operation 130 is performed when nitrogen gas ($N_2$) is present in the PVD chamber along with the Ar plasma and a Ta sputtering target to form the TaN buffer layer 104. In another example where the buffer layer 104 is or includes TaN, the operation 130 is performed in a PVD chamber using a TaN sputtering target and Ar plasma to form the TaN buffer layer 104. During formation of the buffer layer 104 and subsequent layers, the one or more PVD chambers used are maintained at vacuum pressure.

Figure 2A:
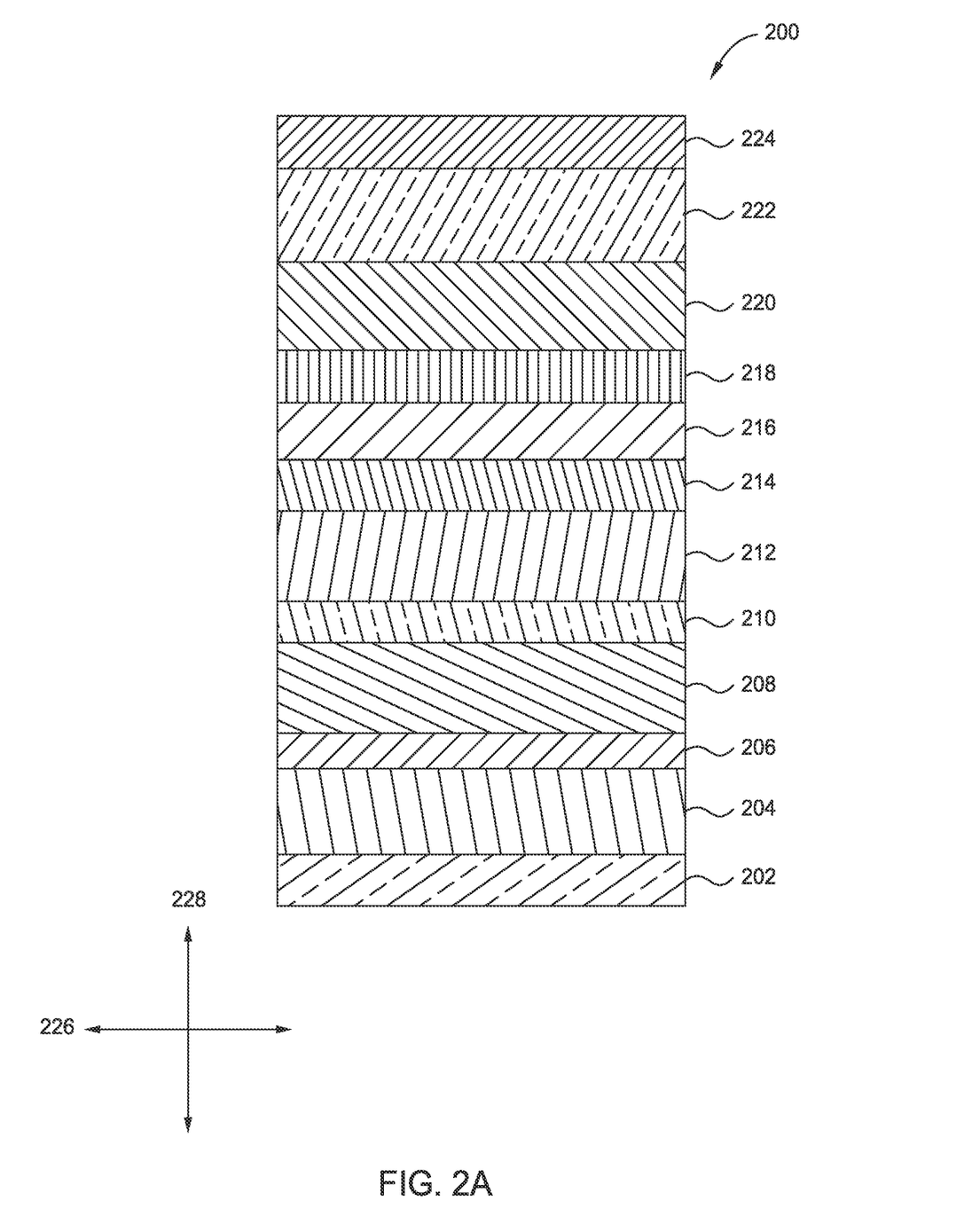
FIG. 2A is a schematic illustration of an MTJ stack according to embodiments of the present disclosure.

Subsequently, in operation 132, the seed layer 106 is deposited on the buffer layer 104 by sputtering a target in a PVD chamber. In an embodiment of operation 132, the seed layer 106 is formed in the same PVD chamber as the PVD chamber used to form the buffer layer 104, using a different sputtering target than the sputtering target used to form the buffer layer 104. In an example of the method 100B according to embodiments of the present disclosure, the seed layer 206 shown in FIG. 2A below can be fabricated at operation 132 in a PVD chamber using Ar plasma and one or more sputtering targets. FIG. 2A shows a coordinate system having an x-axis 226 that is perpendicular to a y-axis 228. The thicknesses discussed herein can be measured in the direction of the y-axis 228. In one example of the formation of the seed layer 206, the sputtering targets in the PVD chamber used to form the seed layer are composed of Cr, or a combination of Cr and one or more of Ni, Fe, Ru, Ir, Co. In another example, the sputtering target(s) used in the PVD chamber at operation 132 are composed of one or more alloy targets including NiCr, NiCrFe, RuCr, IrCr, CoCr, or combinations thereof. The seed layer 206 can be formed to a thickness of 100 Å or less. In one example, the seed layer 206 includes NiCr and is fabricated in the PVD chamber using an NiCr target. In this example, Ar is introduced into the PVD chamber at a flow rate of about 5 sccm-60 sccm, and the flow rate of Ar into the chamber is about 25 sccm in some examples. In another example, the Ar is introduced into the PVD chamber at a flow rate from 10 sccm to 40 sccm, and, in some examples, at a flow rate of 25 sccm. A power of about 50 W-1200 W is applied to the sputtering target at a negative voltage when the Ar is present to form the plasma used for sputtering. In some examples, the power applied to the sputtering target at a negative voltage is from 100 W to 800 W, and in another example, the power applied to the sputtering target is about 500 W.

The first pinning layer 108 is deposited on the seed layer 106 at operation 134 by sputtering a target in a PVD chamber. The first pinning layer 108 is shown as an example in the conventional MTJ stack 100A, and can be formed at operation 134 in a PVD chamber by sputtering one or more targets in the presence of Ar plasma. In an example where the first pinning layer 108 is Co, a Co sputtering target is used in the presence of Ar plasma in the PVD chamber. In an example where the first pinning layer 108 includes one or more bilayers of cobalt and another element, the operation 134 uses a Co sputtering target and another sputtering target composed of the other element of the bilayer. Depending upon the embodiment, the Co sputtering target and the sputtering target of the other metal can be sputtered in the presence of Ar plasma in the same PVD chamber or each layer of the bilayer can be formed in separate PVD chambers.

Figure 2B:
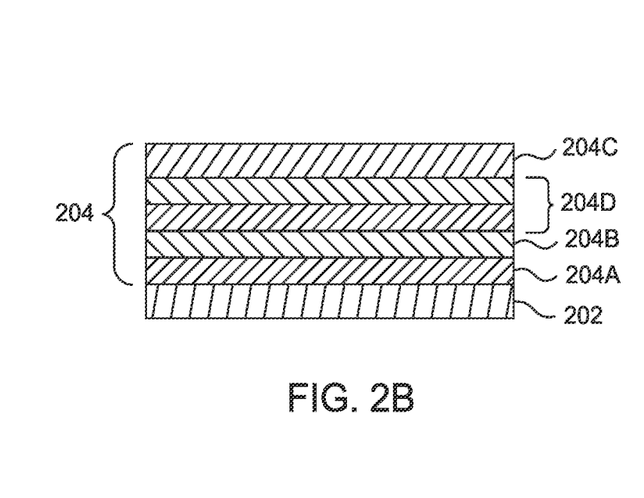
FIG. 2B is a magnified view of the buffer layer of an MTJ stack according to embodiments of the present disclosure.
Figure 2C:
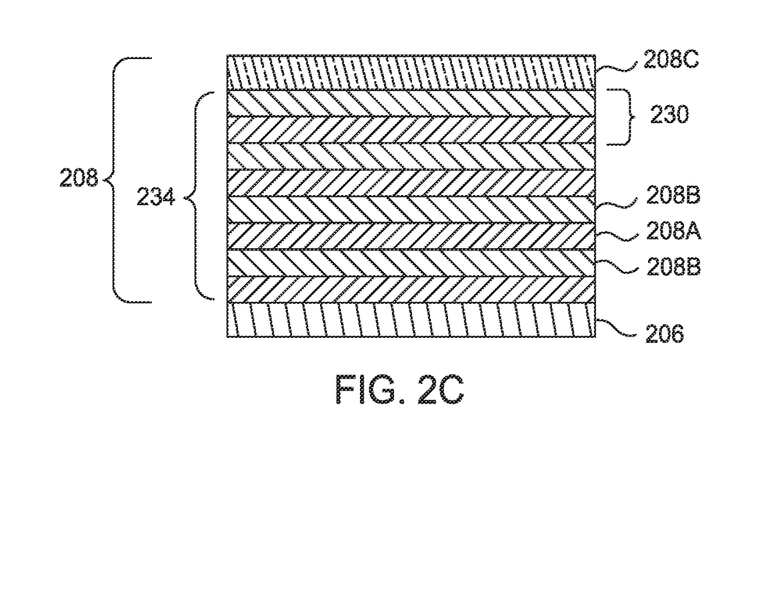
FIG. 2C is a magnified view of the first pinning layer of an MTJ stack according to embodiments of the present disclosure.

In an example according to embodiments of the present disclosure, a first pinning layer 208 as shown in FIG. 2A and FIG. 2C is formed using a PVD chamber at operation 134. In this example, the first pinning layer 208 is formed in a PVD chamber at operation 134 using xenon (Xe) or argon (Ar) that is introduced the PVD chamber at a flow rate of about 2 sccm-40 sccm while a power from 50 W to 10000 W is applied to the target at a negative voltage to form a plasma. In another example, the Xe or Ar is introduce to the PVD chamber at a flow rate from 5 sccm to 20 sccm, and, in some examples, at a flow rate of 10 sccm. In another example, the power applied to the sputtering target is from 100 W to 800 W, and, another example, the power applied to the sputtering target can be 400 W. Depending upon a composition of the first pinning layer 208, Xe can be used in the sputtering operation in the PVD chamber at operation 134 since it is a heavier gas than Ar, and thus yields ions with higher atomic weights than the ions formed using Ar or other, lighter, gases, and thus bombards the target with more energy. In one example of the first pinning layer 208 in the present disclosure, Xe, Ar or a mixture thereof is introduced into the PVD chamber at a flow rate from about 10 sccm and a power of 400 W is applied to the target at a negative voltage to form an Ar or Xe plasma. In one example, the first pinning layer 208 is fabricated from cobalt (Co) as a single layer from about 1 Å to about 18 Å thick by sputtering a Co target. In another example, the first pinning layer 208 is fabricated from one or more bilayers of various materials as shown in FIG. 2C. In various embodiments, a bilayer used to form the first pinning layer 208 includes a first interlayer of Co and a second interlayer of another element. The bilayer of the first pinning layer 208 can be formed at operation 134 in a PVD chamber which includes a plurality of targets including the Co target and a target formed from the other element, or in separate PVD chambers, one PVD chamber containing a Co target and the other PVD chamber containing a target of the other element. In the example where the plurality of targets are disposed in a single PVD chamber in the presence of an Ar plasma and/or Xe plasma, each of the Co target and the target of the other metal can be selectively exposed using the shield discussed herein to form the Co interlayer of the bilayer and to form an interlayer of the other element to form a resultant bilayer. These depositions can be repeated at operation 134 for a plurality of iterations to form a plurality of bilayers of the first pinning layer 208. The SAF coupling layer 110 is deposited on the first pinning layer 108 at operation 136 by sputtering a target of Ru, Cr, Rh, or Ir in the presence of an Ar plasma in a PVD chamber. The second pinning layer 112 is deposited on the SAF coupling layer in a PVD chamber at operation 138. In one example, the second pinning layer 112 is formed of Co using a Co target and an Ar plasma in the PVD chamber. In another example, the second pinning layer 112 includes a bilayer, and may or may not include a Co layer formed in contact with the bilayer. In this example, the second pinning layer 112 is formed in a PVD chamber using a Co sputtering target and a second metal sputtering target, and a shield is adjusted to expose each of the Co and second metal sputtering targets separately, in at least one iteration, to form one or more bilayers of the second pinning layer 112. In other examples, each layer of the bilayer of the second pinning layer 112 can be formed in a different PVD chamber, where one PVD chamber includes a Co sputtering target and the other PVD chamber includes a sputtering target of the second metal.

The SAF coupling layer 110 is deposited on the first pinning layer 108 at operation 136 by sputtering a target of Ru, Cr, Rh, or Ir in the presence of an Ar plasma in a PVD chamber. The second pinning layer 112 is deposited on the SAF coupling layer in a PVD chamber at operation 138. In one example, the second pinning layer 112 is formed of Co using a Co target and an Ar plasma in the PVD chamber. In another example, the second pinning layer 112 includes a bilayer, and may or may not include a Co layer formed in contact with the bilayer. In this example, the second pinning layer 112 is formed in a PVD chamber using a Co sputtering target and a second metal sputtering target, and a shield is adjusted to expose each of the Co and second metal sputtering targets separately, in at least one iteration, to form one or more bilayers of the second pinning layer 112. In other examples, each layer of the bilayer of the second pinning layer 112 can be formed in a different PVD chamber, where one PVD chamber includes a Co sputtering target and the other PVD chamber includes a sputtering target of the second metal.

Figure 2D:
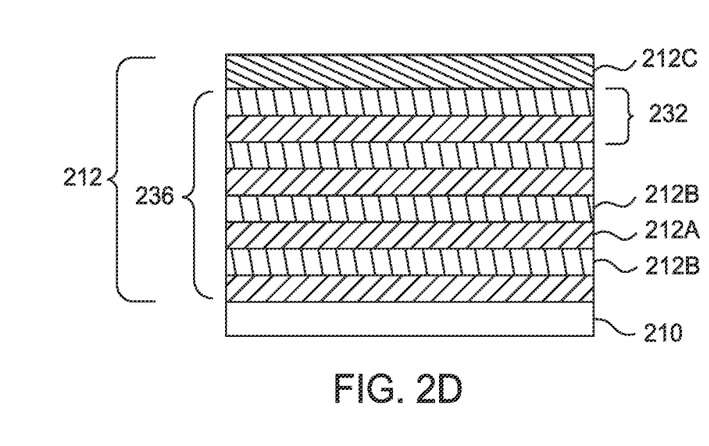
FIG. 2D is a magnified view of the second pinning layer of an MTJ stack according to embodiments of the present disclosure.

In one example of a second pinning layer 212 according to embodiments of the present disclosure as shown in FIGS. 2A and 2D, the second pinning layer 212 is deposited in a PVD chamber at operation 138 using Ar and/or Xe gas, depending upon the material being sputtered. In an embodiment of the present disclosure, the second pinning layer 212 is fabricated at operation 138 as a single layer of cobalt (Co) using a Co sputtering target in the presence of Ar plasma or a plasma comprised of Ar and Xe. In another example, the second pinning layer 212 includes a bilayer that includes a first interlayer formed from Co and a second interlayer of one or more second metals such as Pt, Ir, Ni, or Pd. In another example, which can be combined with other examples herein, the second pinning layer 212 can be formed of a single Co layer alone or in combination with at least one bilayer of a first interlayer of Co and second interlayer of at least one different metal. In this example, the second pinning layer 212 is formed in a PVD chamber using a Co sputtering target and a second metal sputtering target, and a shield is adjusted to expose each of the Co and second metal sputtering targets separately in at least one iteration to form one or more bilayers of the second pinning layer 212. Xenon can be used for depositing the second pinning layer 212 when metals such as Pt are used to form the second pinning layer 212 since Xe is a heavier gas than Ar and can thus interact with heavier metals including Pt more effectively during sputtering processes in a PVD chamber. In an embodiment where Xe is used, the Xe gas is introduced into the PVD chamber at a flow rate from about 2 sccm to about 40 sccm, or from 5 sccm to 20 sccm, and, in some embodiments, the Xe gas is introduced into the PVD chamber at a flow rate of about 10 sccm. During the formation of the second pinning layer 212, a power from 50 W to about 1000 W is applied to the target at a negative voltage to form and maintain the Ar and/or Xe plasma. In some examples, a power from 100 W to 600 W is applied to the target at a negative voltage to form and maintain the Ar and/or Xe plasma, and, in some embodiments a power of about 200 W is used.

The structure blocking layer 114 is formed at operation 140 in a PVD chamber that comprises sputtering targets including Ta, Mo, and/or W, depending upon an intended composition of the structure blocking layer 114. When two or more sputtering targets of Ta, Mo, and W are used, each target may be used in a separate PVD chamber, or the two or more sputtering targets can be sputtered sequentially or simultaneously in the PVD chamber using the shield adjustment discussed above, depending upon the intended composition of the structure blocking layer 114. The magnetic reference layer 116 is subsequently deposited on the structure blocking layer 114 at operation 142, and can be formed in a PVD chamber where other layers of the MTJ stack 100A may also be formed. This may depend, for example, upon the composition of other layers such as the buffer layer 104, if both the buffer layer 104 and magnetic reference layer 116 are $Co_xFe_yB_z$-based. The magnetic reference layer 116 can be formed in a PVD chamber using a sputtering target that is a $Co_xFe_yB_z$ alloy, or by using individual sputtering targets of Co, Fe, or B, or by a combination of an alloy sputtering target and a single-element sputtering target, e.g., a CoFe target and a B target.

The tunnel barrier layer 118 is deposited on the magnetic reference layer 116 at operation 144. In one example of operation 144, the tunnel barrier layer 118 is formed in a PVD chamber using a metal-oxide target such as MgO in the presence of Ar plasma. In an alternate embodiment, the tunnel barrier layer 118 is formed in the PVD chamber at operation 144 using a metal target such as Mg, Ti, Hf, Ta, or Al in the presence of Ar plasma and $O_2$ to form the metal-oxide of the tunnel barrier layer 118. At operation 146, the magnetic storage layer 120 is formed in a PVD chamber. The formation of the magnetic storage layer 120 can occur in various ways depending upon the intended composition.

The magnetic storage layer 120 can include one or more layers of $Co_xFe_yB_z$. In some examples, which can be combined with other examples, the magnetic storage layer 120 can include one or more layers of Ta, Mo, W, or Hf. As such, the deposition of the magnetic storage layer 120 in the PVD chamber can include an Ar plasma, a $Co_xFe_yB_z$ alloy target, individual targets of Co, Fe, and B, or a combination of an alloy target and an element target such as a CoFe target and a B target. In examples where the magnetic storage layer 120 comprises Ta, Mo, W, or Hf, a sputtering target of Ta, Mo, W, or Hf is used in the chamber along with plasma formed from Ar.

In one example, the magnetic storage layer 120 can be formed in a single PVD chamber in the presence of a plasma formed using Ar by adjusting a shield to expose or protect one or more targets such as those discussed above that are used to form $Co_xFe_yB_z$ and layers of Ta, Mo, W, or Hf. In another example, a $Co_xFe_yB_z$ layer of the magnetic storage layer 120 is sputtered in a PVD chamber using a $Co_xFe_yB_z$ alloy target in the presence of Ar plasma. In another example, the $Co_xFe_yB_z$ layer is formed in the PVD chamber using individual Co, Fe, and B, targets in the presence of Ar plasma. In still another example, the $Co_xFe_yB_z$ layer is formed in the PVD chamber using an alloy target and an element target, for example, a CoFe target and a B target, in the presence of Ar plasma. The Ta, Mo, W, or Hf layer can be sputtered in the PVD chamber using a Ta target, a Mo target, a W target, or an Hf target.

At operation 148, the capping layer 122 is deposited on the magnetic storage layer 120. In an embodiment, the first capping interlayer 122A of the capping layer 222 is formed in a PVD chamber that may be different than the PVD chamber where non-oxide layers are formed, as both Ar plasma and $O_2$ are present in the PVD chamber during operation 148 when oxide layers are formed. The first capping interlayer 122A is deposited in the PVD chamber by sputtering a Mg target and a plasma formed from ionized Ar, $O_2$ is also present in the PVD chamber. In another example at operation 148, the first capping interlayer 122A is formed in the PVD chamber using an MgO sputtering target and Ar plasma. In an example where the first capping interlayer 122A is to be formed of the same material (e.g., Mg) as the tunnel barrier layer 118, the PVD chamber used for operation 144 can be the same PVD chamber that is used for operation 148 to form the first capping interlayer 122A. The second capping interlayer 122B is deposited on the first capping interlayer 122A at operation 150. Operation 150 can occur in a separate, different, PVD chamber than that used to sputter the first capping interlayer 122A if $O_2$ is used in operation 148, since there is no $O_2$ used in the PVD chamber to form the first capping interlayer 122A. The second capping interlayer 122B is formed in a PVD chamber using Ar plasma and one or more sputtering targets composed of Ru, Ir, and/or Ta. Depending upon the composition of the second capping interlayer 122B, the operation 150 may occur in a PVD chamber that is also used to form, for example, the SAF coupling layer 110 at the operation 136.

Further in the method 1006, at operation 152, a hardmask layer 124 is deposited over the second capping interlayer 122B in a PVD chamber. Depending upon the type of hardmask layer 124 used in the MTJ stack 100A, the operation 152 may or may not occur in the presence of $O_2$. For example, if the hardmask layer 124 is a metal-oxide hardmask, $O_2$ can be used during operation 152 along with a metallic target or targets to form the metal-oxide layer, or a metal-oxide sputtering target can be used to deposit the hardmask layer 124, in which case $O_2$ is not used to form the hardmask layer 124 at operation 150. In some embodiments, when the hardmask layer 124 is amorphous carbon or spin-on carbon, the operation 152 in a CVD chamber.

Further in the method 100B, the MTJ stack 100A (or MTJ stack 200 shown below in FIG. 2A) formed at operations 128A-152 can be subjected to one or more processes that are collectively indicated by operation 154 in the method 1006. These operations can include high-temperature (on the order of 400° C.) operations. In one example, the processes at operation 154 may include a pre-patterning anneal operation, which is followed by an MTJ patterning operation. In an alternate embodiment, the MTJ patterning at operation 154 can include a plurality of processes such as patterning the hardmask layer 124 and can further include an operation to etch the MTJ stack 100A after the hardmask layer 124 is patterned to form a plurality of individual pillars from the MTJ stack.

In an alternate embodiment at operation 154, a thermal annealing operation is executed to repair, crystallize, and enhance lattice structures of the film stack, including the magnetic storage layer(s) and the magnetic reference layer(s) in the MTJ stack 100A. The thermal annealing performed at operation 154 can act to further crystallize at least the material of the magnetic reference layer(s) 116 and magnetic storage layer(s) 120. The crystallization of the magnetic reference layer(s) and magnetic storage layer(s) upon deposition of those layers establishes the perpendicular anisotropy of the MTJ stack 100A, while maintaining the desired electrical and mechanical properties. Embodiments of MTJ stacks fabricated following the operations of the method 1006 are shown and discussed below. The embodiments are configured to maintain the as-deposited fcc <111> crystalline structure of the pinning layers after the thermal annealing operation executed at operation 154, and/or during additional or alternate back end processing operations that occur at high temperatures on the order of 400° C.

The MTJ stacks fabricated according to embodiments of the present disclosure employ chromium-based seed layers, including a seed layer including at least one of chromium (Cr), nickel chromium (NiCr), iron nickel chromium (NiFeCr), ruthenium chromium (RuCr), iridium chromium (IrCr), or cobalt chrome (CoCr), in contrast to the conventional usage of Ru or Ir for the seed layer. The seed layer is disposed in the film stack from which the memory cells are defined between a first pinning layer and a buffer layer. The Cr-containing seed layers discussed herein improve adhesion of the first pinning layer because of the lattice matching between the seed layer and the first pinning layer which aids in stabilizing the first pinning layer as well as layers formed on top of the first pinning layer. In one example, the seed layer is in direct contact with both the first pinning layer and the buffer layer, and in other examples, there is a transitional layer between the seed layer and the first pinning layer or between the seed layer and the buffer layer. The pinning layers discussed herein can be fabricated from cobalt, or as one or more bilayers each of which includes cobalt, or a combination of a bilayer structure and an overlayer of cobalt, as discussed below. An "overlayer" as discussed herein is a layer formed over another structure that may include one or more layers, including bilayers. Depending upon the embodiment, the first and the second pinning layers can include the same layer structure, materials, and/or thickness, or can vary in layer structure, materials, and/or thickness. Using the MTJ stacks discussed herein, the crystal structure of the SAF layer and the magnetic coupling of the magnetic reference layer and the magnetic storage layer are substantially maintained in a crystalline state, even after annealing the layers for a period of from 0.5 hours to at least 3 hours at about 400° C. Further in the embodiments herein, the MTJ stacks continue to exhibit tunnel magnetoresistance (TMR) from 100% to 175% even after annealing thereof for 0.5 hours to at least 3 hours at about 400° C.

FIG. 2A is a schematic illustration of an MTJ stack 200 according to an embodiment of the present disclosure. In the illustrated embodiment, a buffer layer 204 is formed via sputtering in a PVD chamber on a conductive portion of a substrate 202, or on a conductive film layer on the substrate 202. The substrate 202 can include tungsten (W), tantalum nitride (TaN), titanium nitride (Tin), or other metal layers. The buffer layer 204 improves the adhesion of a seed layer 206 to the substrate 202, which aids in the formation and performance of subsequently-deposited layers of the MTJ stack 200. The buffer layer 204 comprises $Co_xFe_yB_z$, Ta, and/or TaN, and is formed in one or more PVD deposition operations in a PVD chamber in the presence of Ar plasma. In various examples, the buffer layer 104 is formed in a PVD chamber using Ar plasma and a sputtering target that is a $Co_xFe_yB_z$ alloy, or by using individual sputtering targets of Co, Fe, or B, or by a combination of an alloy sputtering target and a single-element sputtering target, e.g., a CoFe target and a B target. In an example where a Ta layer is included in the buffer layer 204, the Ta layer can be formed in a PVD chamber using a Ta target and Ar plasma.

In one example, the buffer layer 204 comprises TaN and it is sputtered onto the substrate 202 in the PVD chamber using a Ta target in the presence of both Ar plasma and $N_2$, the $N_2$ reacts with the Ta material sputtered from the Ta target to form the TaN layer. In another example, a TaN sputtering target is used in the PVD chamber with Ar plasma to form the buffer layer 204. In one example, the buffer layer 204 is sputtered directly on and in contact with a conductive layer on the substrate 202. In other examples, there is a conductive transitional layer in between the conductive layer on the substrate 202 and the buffer layer 204 that does not affect performance of the MTJ stack. The buffer layer 204 is optionally employed in the illustrated embodiment, and may not be used in some embodiments discussed herein. An overall thickness of the buffer layer 204 is from 0 Å (no buffer layer used) to about 60 Å. In one example, the buffer layer 204 is a single layer of Ta, TaN, or $Co_xFe_yB_z$ sputtered directly on, and in contact with, a conductive layer on the substrate 202 to a thickness of up to 10 Å. In another example, the buffer layer 204 is a combination of layers, and each layer of the buffer layer 204 is Ta, TaN, or $Co_xFe_yB_z$ and is from 1 Å to 60 Å thick. In an example where TaN is employed for the buffer layer 204 instead of Ta or $Co_xFe_yB_z$, a thickness can be 20 Å. In one example where $Co_xFe_yB_z$ is used alone to form the buffer layer 204 a layer thickness is 10 Å. In another example of the buffer layer 204, Ta or TaN is employed in conjunction with $Co_xFe_yB_z$, and a thickness of the buffer layer 204 is 20 Å.

The seed layer 206 is deposited in a PVD chamber via sputtering one or more targets. The seed layer 206 is deposited on the buffer layer 204. The seed layer 206 comprises Cr, NiCr, NiCrFe, RuCr, IrCr, CoCr, or combinations thereof. The seed layer 206 may be formed as one or more layers of Cr, NiCr, NiCrFe, RuCr, IrCr, or CoCr, which can include combinations of those elements or combinations of alloys in a single layer. The formation of the seed layer 206 in the PVD chamber is discussed in detail above at operation 132. In an embodiment, the seed layer 206 is 100 Å or less in thickness, and, in one example, the seed layer 206 is from about 30 Å to about 60 Å thick. In one example, the seed layer 206 is formed directly on and in contact with the buffer layer 204. In other examples, there is a transitional layer in between the seed layer 206 and the buffer layer 204 that does not affect performance of the MTJ stack.

Further in the MTJ stack 200, a first pinning layer 208 is formed on the seed layer 206 in a PVD chamber. The formation of the first pinning layer 208 is shown in detail above at operation 134 of the method 100B in FIG. 1B, and occurs in a PVD chamber using a plasma of ionized Ar and one or more sputtering targets. In one example, the first pinning layer 208 is fabricated as a single layer of cobalt (Co) having a thickness of about 1 Å to about 18 Å. In another example, the first pinning layer 208 is fabricated from one or more bilayers of various materials, each bilayer can include two interlayers. The first pinning layer 208 can include one or more bilayers alone or in combination with a Co layer, as shown in FIG. 2C. In an example where one or more bilayers are included in the first pinning layer 208, each bilayer contains a first interlayer of Co and a second interlayer of another element. The first pinning layer 208 is formed by sputtering a Co target using Ar plasma and, subsequently, sputtering a second target of Pt, Ir, Ni, or Pd using the Ar plasma. In an example where Pt is used with Co to form the bilayer, Xe plasma may be used instead of or in addition to Ar plasma. In an embodiment where one or more bilayers are used to form the first pinning layer, repeated deposition cycles in the PVD chamber can be performed by forming a first interlayer of a bilayer, where the first interlayer comprises Co, by shielding targets that do not include Co. Subsequently, the Co target and other targets are shielded to expose a second target that comprises a second element to be used for the second interlayer of the bilayer. This may be repeated in an iterative fashion to form one or more bilayers of the first pinning layer 208. In one example, the first pinning layer 208 is formed in the PVD chamber directly on and in contact with the seed layer 206. In other examples, there is a transitional layer in between the seed layer 206 and the first pinning layer 208 that does not affect performance of the MTJ stack.

A synthetic antiferromagnet (SAF) coupling layer 210 is sputter deposited in a PVD chamber on the first pinning layer 208, and a second pinning layer 212 is sputter deposited on the SAF coupling layer 210. The SAF coupling layer 210 is formed in the PVD chamber in the presence of plasma formed from ionized Ar gas using a Ru sputtering target, an Rh sputtering target, a Cr sputtering target, or an Ir sputtering target. The SAF coupling layer 210 comprises a thickness from about 3 Å to about 10 Å. In an embodiment, the second pinning layer 212 is fabricated by sputtering a cobalt (Co) target in a PVD chamber in the presence of a plasma formed from ionized Ar gas. In one example, the SAF coupling layer 210 is formed directly on and in contact with the first pinning layer 208 and the second pinning layer 212. In other examples, there is a transitional layer in between the SAF coupling layer 210 and either or both of the first pinning layer 208 or second pinning layer 212 that does not affect performance of the MTJ stack.

The formation of the second pinning layer 212 is shown in operation 138 of the method 100B in FIG. 1B above. In an example where one or more bilayers of Co and another element are included in the second pinning layer 212, the second pinning layer 212 is formed by sputtering a Co target using an Ar plasma and, subsequently, sputtering a second target of Pt, Ir, Ni, or Pd using the Ar plasma. Repeated deposition cycles in a PVD chamber using the Co target and the second target in the presence of Ar plasma can be used to form the one or more bilayers of the second pinning layer 212. In one example, the second pinning layer 212 is sputtered as a single Co layer from a thickness from about 1 Å to about 10 Å. In another example, the thickness of the second pinning layer 212 is about 5 Å. Alternate configurations of the second pinning layer 212 are shown in FIG. 2D.

Further in the MTJ stack 200, a structure blocking layer 214 is optionally formed on the second pinning layer 212 by sputtering in a PVD chamber. The structure blocking layer 214 prevents against formation of a short circuit between the MTJ stack 200 and metallic contacts that can be coupled to the MTJ stack 200 to form MRAM memory cells. During sputtering of the structure blocking layer 214, depending upon the intended composition of the layer, one or more individual Ta, Mo, or W sputtering targets can be used in the PVD chamber along with an Ar plasma. In other examples, during formation of the structure blocking layer 214, or one or more alloy targets including alloys of Ta, Mo, and/or W can be used in the PVD chamber with the Ar plasma. The structure blocking layer 214 is a body-centered-cubic (bcc) structure oriented in the <100> direction, in contrast to the seed layer 206 and the first pinning layer 208 and the second pinning layer 212 which can each be oriented in a face-centered-cubic <111> direction. The structure blocking layer 214 is from 0 (no layer) Å to about 8 Å thick, and, in one example, a thickness of 4 Å is sputter deposited. In one example, the structure blocking layer 214 is formed directly on and in contact with the second pinning layer 212 during sputter deposition. In other examples, there is a transitional layer in between the structure blocking layer 214 and the second pinning layer 212 that does not affect performance of the MTJ stack.

A magnetic reference layer 216 is formed on the structure blocking layer 214 by sputter deposition in a PVD chamber in the presence of Ar plasma. The magnetic reference layer 216 can be formed in the PVD chamber using a single Co—Fe—B alloy sputtering target, or by using two or more of a Co sputtering target, an Fe sputtering target, or a B sputtering target. In another example, the magnetic reference layer 216 can be formed in the PVD chamber in the presence of Ar plasma using an alloy target and an element target, such as a CoFe target and a B target. The magnetic reference layer 216 can be sputtered to a thickness from 1 Å to 15 Å, and, in one example, can be formed to a thickness of 10 Å. The magnetic reference layer 216 comprises $Co_xFe_yB_z$. In one example, z is from about 10 wt. % to about 40 wt. %, y is from about 20 wt. % to about 60 wt. %, and x is equal to or less than 70 wt. %. In another example, which can be combined with other examples herein, z is at least 20 wt. %. In one example, the magnetic reference layer 216 is formed directly on and in contact with the structure blocking layer 214. In other examples, there is a transitional layer between the magnetic reference layer 216 and the structure blocking layer 214 that does not affect performance of the MTJ stack.

A tunnel barrier layer 218 is formed on the magnetic reference layer 216 using sputtering of a target in a PVD chamber in an Ar plasma. The tunnel barrier layer 218 comprises a metal-oxide such as magnesium oxide (MgO), hafnium oxide ($HfO_2$), titanium oxide ($TiO_2$), tantalum oxide ($TaO_x$), aluminum oxide ($Al_2O_3$), or other materials as appropriate for various applications. Thus, the tunnel barrier layer 218 can be formed in the PVD chamber in the presence of Ar using a sputtering target of a metal-oxide. Alternately, the tunnel barrier layer 218 can be formed in the PVD chamber in the presence of Ar and $O_2$ using a sputtering target of the metal of the desired metal-oxide, where the metal-oxide layer when the metal layer sputtered from the metal sputtering target is exposed to the $O_2$. The tunnel barrier layer 218 has a thickness from 1 Å to 15 Å, with a thickness of 10 Å in some embodiments. In one example, tunnel barrier layer 218 is formed directly on and in contact with the magnetic reference layer 216. In other examples, there is a transitional layer between the tunnel barrier layer 218 and the magnetic reference layer 216 that does not affect performance of the MTJ stack.

In an embodiment, the MTJ stack 200 further comprises a magnetic storage layer 220 formed on the tunnel barrier layer 218 using a sputtering operation in a PVD chamber as discussed herein. The magnetic storage layer 220 can include one or more layers of $Co_xFe_yB_z$. In some examples, the magnetic storage layer 220 can alternatively or additionally include one or more layers of Ta, Mo, W, or Hf. As such, the deposition of the magnetic storage layer 220 in the PVD chamber can include using Ar plasma, a $Co_xFe_yB_z$ alloy target, or individual targets of Co, Fe, and B, or a combination of an alloy target and an element target such as a CoFe target and a B target. In examples where the magnetic storage layer 220 includes Ta, Mo, W, or Hf, a sputtering target of Ta, Mo, W, or Hf is used in the chamber along with a plasma formed of Ar.

Figure 2E:
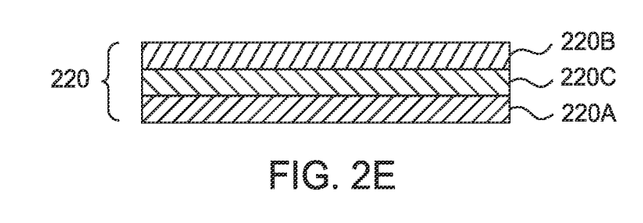
FIG. 2E is a magnified view of an example magnetic storage layer of an MTJ stack according to embodiments of the present disclosure.

The magnetic storage layer 220 is from about 5 Å to about 20 Å in thickness depending upon factors including a material or materials used to form the magnetic storage layer 220. In one example, the magnetic storage layer is fabricated from $Co_xFe_yB_z$ where z is from about 10 wt. % to about 40 wt. %, y is from about 20 wt. % to about 60 wt. %, and x is equal to or less than 70 wt. %. In this example, the thickness of the magnetic storage layer 220 is from 5 Å to 40 Å and, in some embodiments, a target layer thickness is 20 Å. In one example, the magnetic storage layer 220 is formed directly on and in contact with the tunnel barrier layer 218. In other examples, there is a transitional layer in between the magnetic storage layer 220 and the tunnel barrier layer 218 that does not affect performance of the MTJ stack. The magnetic storage layer is shown in FIG. 2E below.

Figure 2F:
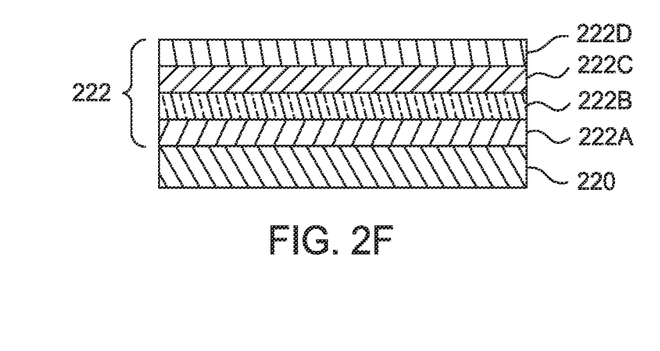
FIG. 2F is a magnified view of an example capping layer of an MTJ stack according to embodiments of the present disclosure.

Further in an embodiment of the MTJ stack 200, a capping layer 222 is formed on the magnetic storage layer 220, and includes a plurality of interlayers that form the capping layer 222, including an oxide that contains iron (Fe). Additionally, in some embodiments, a hard mask layer 224 is formed directly on and in contact with the capping layer 222. In another example, the hard mask layer 224 is formed on the capping layer 222 with a transitional layer in between the capping layer 222 and the hard mask layer 224; such transitional layer does not affect the performance of the MTJ stack 200. The hard mask layer 224 may be formed of a metal-oxide, amorphous carbon, ceramics, metallic materials, or combinations thereof. In one example, the magnetic storage layer 220 is formed directly on and in contact with the capping layer 222. In other examples, there is a transitional layer between the magnetic storage layer 220 and the capping layer 222 that does not affect performance of the MTJ stack 200. The capping layer 222 is shown in FIG. 2F below.

In one example of the MTJ stack 200, the MTJ stack 200 includes a seed layer 206 fabricated from NiCr, a first pinning layer 208 fabricated from a Co/Pt bilayer stack, and a second pinning layer 212 fabricated from Co. In this example, the MTJ stack 200 exhibits a TMR of 175%, for example, when annealed at about 400° C. for 0.5 hours. The TMR of the MTJ stack 200 is maintained at about 175% when the MTJ stack 200 is annealed at about 400° C. for 3 hours.

FIG. 2B is a magnified view of the buffer layer 204 according to embodiments of the present disclosure. The buffer layer 204 includes tantalum (Ta) or TaN, or a layered stack of Ta and TaN, and, in some examples, includes $Co_xFe_yB_z$, alone or in combination with Ta, TaN, or a Ta/TaN layered stack. In an example of the buffer layer 204, the buffer layer 204 includes at least one bilayer 204D. The at least one bilayer 204D includes a first buffer interlayer 204A and a second buffer interlayer 204B formed in an alternating fashion on the substrate 202 for at least one iteration of the at least one bilayer 204D. In this example, the first buffer interlayer 204A includes Ta and the second buffer interlayer 204B includes TaN, and the first buffer interlayer 204A is in contact with the substrate 202. In another example the first buffer interlayer 204A includes TaN and the second buffer interlayer 204B includes Ta, and thus TaN is in direct contact with the substrate 202.

In other examples of the buffer layer 204, as shown in FIG. 2A, $Co_xFe_yB_z$ is used alone for the buffer layer 204 and would thus be in direct contact with the substrate 202. In another example, as shown in FIG. 2B, a third buffer layer 204C is formed over the at least one bilayer 204D. In this example, the third buffer layer 204C is fabricated from $Co_xFe_yB_z$ and formed to a thickness of up to 10 Å. Thus, depending upon the configuration of the buffer layer 204, a thickness of the buffer layer 204 ranges from 1 Å thick to 60 Å thick. In an example where the third buffer layer 204C $Co_xFe_yB_z$ is employed, z is from about 10 wt. % to about 40 wt. %, y is from about 20 wt. % to about 60 wt. %, and x is equal to or less than 70 wt. %.

FIG. 2C is a magnified view of the first pinning layer 208 according to an embodiment of the present disclosure. In an embodiment, the first pinning layer 208 is fabricated from at least one bilayer 230, and when two or more bilayers are employed, the bilayers can be said to form a bilayer stack 234. Each bilayer 230 is fabricated from a first interlayer 208A and a second interlayer 208B. The bilayers of the first pinning layer 208 are expressed as $(X/Y)_n$, $(208A/208B)_n$, where each bilayer is a combination of X and Y materials, and n is a number of bilayers in the first pinning layer 208. In an embodiment, X is Co and Y is one of Pt, Ir, Ni, or Pd. While n=4 in the example in FIG. 2C, in alternate embodiments, n is from 1 to 10. In an embodiment, the at least one bilayer 230 includes a thickness from about 2 Å to about 15 Å. In one example, the first interlayer 208A includes Co and is from about 1 Å to about 7 Å thick and the second interlayer 208B is from about 1 Å to about 8 Å thick. In another example, a desired layer thickness of each of the first interlayer 208A and the second interlayer 208B is from about 2.4 Å to about 5 Å. Further in another embodiment, the first pinning layer 208 includes the at least one bilayer 230 formed directly on and in contact with the seed layer 206 in addition to an overlayer 208C of Co formed on top of the at least one bilayer 230. In this example, the overlayer 208C is from about 1 Å to about 10 Å thick. Depending upon the embodiment, an overall thickness of the first pinning layer 208, which may include one or more layers including the at least one bilayer 230 as discussed herein, is from 0.3 nm to about 18 nm. In other examples, one or more transitional layers may be formed between the first pinning layer 208 and the seed layer 206 that do not negatively affect the properties of the MTJ stack.

FIG. 2D is a magnified view of the second pinning layer 212 according to embodiments of the present disclosure. In an embodiment, the second pinning layer 212 is fabricated from a single cobalt layer as shown in FIG. 2A. In alternate embodiments, the second pinning layer 212 is fabricated from at least one bilayer 232. The at least one bilayer 232 includes a first interlayer 212A formed from Co and a second interlayer 212B formed from one or more of Pt, Ir, Ni, or Pd. When two or more bilayers such as the bilayer 232 are employed in the second pinning layer 212, the plurality of bilayers may be referred to as a bilayer stack 236. Thus, at operation 138 in FIG. 1B, when one or more bilayers are used, a separate sputtering target may be used to form each layer of the bilayer. The at least one bilayer 232 of the second pinning layer 212 is expressed as $(X/Y)_n$, $(212A/212B)_n$, where n is a number of bilayers. While n=4 in the example in FIG. 2D, in alternate embodiments, n is from 1 to 10. In an embodiment, the at least one bilayer 232 includes a total thickness from about 2 Å to about 15 Å. In one example, the first interlayer 212A is a Co layer from about 1 Å to about 7 Å thick and the second interlayer 212B is from about 1 Å to about 8 Å thick. In another example, thickness of each of the first interlayer 212A and the second interlayer 212B is from about 2.4 Å to about 5 Å.

Further in another embodiment, the second pinning layer 212 includes at least one bilayer 232 formed directly on and in contact with the SAF coupling layer 210 in addition to an overlayer 212C of Co on top of the at least one bilayer 232. In some examples, a transitional layer may be employed between the at least one bilayer 232 and the second pinning layer 212 or between the at least one bilayer 232 and the SAF coupling layer 210, or both, where such transition layer(s) do not affect performance of the MTJ stack. In this example, the overlayer 212C is from about 1 Å to about 10 Å thick. Depending upon the embodiment, an overall thickness of the second pinning layer 212, which may include one or more layers including the at least one bilayer 232 as discussed herein, is from 0.3 nm to about 18 nm.

In an embodiment, the first pinning layer 208 and second pinning layer 212 each include at least one of the same composition or the same thickness. In an alternate embodiment, the first pinning layer 208 and second pinning layer 212 each include different compositions and/or thicknesses. In an embodiment, the first pinning layer 208 is Co and the second pinning layer 212 is formed from one or more bilayers. Each bilayer of the second pinning layer 212 includes a first interlayer of Co and a second interlayer of Pt. In another embodiment, the first pinning layer 208 is Co and the second pinning layer 212 is formed from one or more Co/Ni bilayers. In yet another embodiment, the first pinning layer 208 includes one or more bilayers, each bilayer containing a first interlayer of Co and a second interlayer of Ni, and the second pinning layer 212 includes one or more bilayers, each bilayer containing a first interlayer of Co and a second interlayer of Pt. In yet another embodiment, the first pinning layer 208 includes one or more bilayers, each bilayer containing a first interlayer of Co and a second interlayer of Pt, and the second pinning layer 212 includes one or more bilayers, each bilayer containing a first interlayer of Co and a second interlayer of Ni.

FIG. 2E is a magnified view of an example magnetic storage layer 220 according to embodiments of the present disclosure. As shown in FIG. 2E, a first magnetic layer 220A of the magnetic storage layer 220 and a second magnetic layer 220B of the magnetic storage layer 220 are each fabricated from $Co_xFe_yB_z$. A third layer 220C fabricated from Ta, Mo, W, Hf, or combinations thereof is disposed therebetween, and it contains dopants such as boron, oxygen, or other dopants. The magnetic storage layer 220 is thus fabricated from three layers, a first magnetic layer 220A and a second magnetic layer 220B, and a third layer 220C disposed between the first magnetic layer 220A and the second magnetic layer 220B. The third layer 220C strengthens a pinning moment perpendicular to the substrate plane (e.g., a plane perpendicular to the substrate 202), which promotes magnetic anisotropy, a directional dependence of the structure's magnetic properties.

FIG. 2F is a magnified view of an example capping layer 222 according to an embodiment of the present disclosure. A total thickness of the capping layer 222 is from 2 Å to 120 Å and in some embodiments a total desired thickness for the capping layer (e.g., including all interlayers as shown in FIG. 2F) is about 60 Å. In an embodiment, the capping layer 222 includes a plurality of interlayers. A first capping interlayer 222A is fabricated from MgO or another iron-containing oxide formed directly on the magnetic storage layer 220 to a thickness from about 2 Å to about 10 Å. On top of the first capping interlayer 222A, a second capping interlayer 222B of Ru, Ir, or combinations thereof is formed to a thickness from 1 Å to about 30 Å. In an embodiment, a third capping interlayer 222C is optionally formed of Ta on the second capping interlayer 222B to a thickness of 1 Å to about 30 Å. Thus, some embodiments of a capping layer 222 do not contain a third capping interlayer 222C. In an embodiment, a fourth capping interlayer 222D is optionally formed on the third capping interlayer 222C and is formed of Ru, Ir, or combinations thereof to a thickness of up to 50 Å. In various embodiments, the capping layer 222 includes only the first capping interlayer 222A, or the first capping interlayer 222A and the second capping interlayer 222B, or the first capping interlayer 222A, the second capping interlayer 222B, and a third capping interlayer 222C, or the first, second, and third capping layers 222A-222C. In some embodiments, transitional layers may be used in between some or all of the first capping interlayer 222A, the second capping interlayer 222B, and the third capping interlayer 222C, or may be between the capping layer 222 and the magnetic storage layer 220, such that the performance of the MTJ stack is not negatively impacted by the transitional layer(s).

The MTJ stacks discussed herein have improved performance after undergoing processing at temperatures at or above 400° C. The improved performance is promoted by the lattice matching between the structure of the seed layer and of the first pinning layer as a result of using a Cr seed layer or a Cr-containing seed layer in combination with the first pinning layer that also includes Cr. The lattice matching between the structures of the seed layer and the first pinning layer inhibits roughness formation at the interface of the seed layer and the first pinning layer, such roughness formation results in a lack of flatness in one or more layers. The MTJ stacks are thus able to maintain structural integrity as well as desirable magnetic and electrical properties. Further in the embodiments discussed herein, the combinations of first and second pinning layer compositions with the seed layer can increase desirable magnetic properties even after high temperature processing.

While the foregoing is directed to embodiments of the present disclosure, other and further embodiments of the disclosure may be devised without departing from the basic scope thereof, and the scope thereof is determined by the claims that follow.

What is claimed is:

1. A magnetic tunnel junction stack comprising:
a buffer layer comprising a plurality of sublayers, wherein each sublayer of the plurality of sublayers comprises $Co_xFe_yB_z$, tantalum (Ta), tantalum nitride (TaN), or combinations thereof;
a seed layer formed on the buffer layer, the seed layer comprising chromium (Cr);
a first pinning layer in direct contact with the seed layer, the first pinning layer comprising at least one bilayer, the at least one bilayer comprising:
a first interlayer formed from cobalt (Co); and
a second interlayer formed from platinum (Pt), iridium (Ir), nickel (Ni), or palladium (Pd); and
a second pinning layer formed over the first pinning layer, wherein the buffer layer, the seed layer, the first pinning layer and the second pinning layer form a portion of the magnetic tunnel junction stack.

2. The stack of claim 1, further comprising:
a magnetic reference layer formed over the second pinning layer;
a tunnel barrier layer formed over the magnetic reference layer;
a magnetic storage layer formed over the tunnel barrier layer;
a coupling layer in direct contact with the first pinning layer and the second pinning layer; and
a structure blocking layer in direct contact with the second pinning layer.

3. The stack of claim 1, wherein each sublayer of the buffer layer has a thickness between about 1 Å and about 60 Å.

4. The stack of claim 1, wherein the seed layer comprises nickel chromium (NiCr), iron nickel chromium (NiCrFe), ruthenium chromium (RuCr), iridium chromium (IrCr), cobalt chrome (CoCr), or a combination thereof.

5. The stack of claim 4, wherein the seed layer comprises a plurality of sublayers, and wherein each sublayer of the seed layer comprises nickel chromium (NiCr), iron nickel chromium (NiCrFe), ruthenium chromium (RuCr), iridium chromium (IrCr), or cobalt chrome (CoCr).

6. The stack of claim 1, wherein the seed layer has a thickness of about 100 Å or less.

7. The stack of claim 6, wherein the seed layer has a thickness between about 30 Å and about 60 Å.

8. A magnetic tunnel junction stack comprising:
a buffer layer comprising a plurality of sublayers, wherein each sublayer comprises $Co_xFe_yB_z$, tantalum (Ta), tantalum nitride (TaN), or combinations thereof;
a seed layer formed in direct contact with the buffer layer, the seed layer comprising chromium (Cr);
a first pinning layer in direct contact with the seed layer, the first pinning layer comprising at least one bilayer, the at least one bilayer comprising:
a first interlayer comprising cobalt (Co); and
a second interlayer comprising platinum (Pt), iridium (Ir), nickel (Ni), or palladium (Pd);
a second pinning layer formed over the first pinning layer, the second pinning layer comprising at least one bilayer;
a magnetic reference layer formed over the second pinning layer;
a tunnel barrier layer formed over the magnetic reference layer; and
a magnetic storage layer formed over the tunnel barrier layer.

9. The stack of claim 8, wherein the seed layer is nickel chromium (NiCr), iron nickel chromium (NiCrFe), ruthenium chromium (RuCr), iridium chromium (IrCr), cobalt chrome (CoCr), or a combination thereof.

10. The stack of claim 8, wherein each sublayer of the buffer layer has a thickness between about 1 Å and about 60 Å.

11. The stack of claim 8, wherein the seed layer comprises a plurality of sublayers, and wherein each sublayer of the seed layer comprises nickel chromium (NiCr), iron nickel chromium (NiCrFe), ruthenium chromium (RuCr), iridium chromium (IrCr), or cobalt chrome (CoCr).

12. The stack of claim 8, wherein the seed layer has a thickness of about 100 Å or less.

13. The stack of claim 12, wherein the seed layer has a thickness between about 30 Å and about 60 Å.

14. A magnetic tunnel junction stack comprising:
- a substrate having a buffer layer formed thereon, the buffer layer comprising a plurality of sublayers, wherein each sublayer comprises $Co_xFe_yB_z$, tantalum (Ta), tantalum nitride (TaN), or combinations thereof;
- a seed layer formed over the buffer layer, the seed layer comprising chromium (Cr), nickel chromium (NiCr), iron nickel chromium (NiCrFe), ruthenium chromium (RuCr), iridium chromium (IrCr), cobalt chrome (CoCr), or a combination thereof;
- a first pinning layer in direct contact with the seed layer, the first pinning layer comprising at least one bilayer, the at least one bilayer of the first pinning layer comprising:
  - a first interlayer comprising cobalt (Co); and
  - a second interlayer comprising platinum (Pt), iridium (Ir), nickel (Ni), or palladium (Pd);
- a coupling layer in contact with the first pinning layer;
- a second pinning layer formed over the coupling layer, the second pinning layer comprising at least one bilayer, the at least one bilayer of the second pinning layer comprising:
  - a first interlayer comprising cobalt (Co); and
  - a second interlayer comprising platinum (Pt), iridium (Ir), nickel (Ni), or palladium (Pd);
- a magnetic reference layer formed over the second pinning layer;
- a tunnel barrier layer formed over the magnetic reference layer; and
- a magnetic storage layer formed over the tunnel barrier layer.

15. The stack of claim 14, wherein the seed layer comprises a plurality of sublayers, and wherein each sublayer of the seed layer comprises nickel chromium (NiCr), iron nickel chromium (NiCrFe), ruthenium chromium (RuCr), iridium chromium (IrCr), or cobalt chrome (CoCr).

* * * * *